United States Patent
Wang et al.

(10) Patent No.: US 9,490,152 B2
(45) Date of Patent: Nov. 8, 2016

(54) ASYMMETRICAL CHAMBER CONFIGURATION

(75) Inventors: Lan-Hai Wang, Zhubei (TW); Ding-I Liu, Hsin-Chu (TW); Si-Wen Liao, Hsin-Chu (TW); Yong-Hung Yang, Hsin-Chu (TW); Jia-Wei Hsu, Taichung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 1164 days.

(21) Appl. No.: 13/482,814

(22) Filed: May 29, 2012

(65) Prior Publication Data
US 2013/0319543 A1 Dec. 5, 2013

(51) Int. Cl.
*C23C 16/455* (2006.01)
*H01L 21/67* (2006.01)
*H01L 21/762* (2006.01)

(52) U.S. Cl.
CPC ....... *H01L 21/67161* (2013.01); *C23C 16/455* (2013.01); *C23C 16/45587* (2013.01); *C23C 16/45589* (2013.01); *C23C 16/45591* (2013.01); *H01L 21/6719* (2013.01); *H01L 21/76224* (2013.01); *Y10T 137/6416* (2015.04)

(58) Field of Classification Search
CPC .................. H01L 21/67161; H01L 21/76224; H01L 21/6719; Y10T 137/6416; C23C 16/455; C23C 16/45587; C23C 16/45589; C23C 16/45591
USPC ............... 118/715, 719; 156/345.22, 345.29, 156/345.31
See application file for complete search history.

(56) References Cited

U.S. PATENT DOCUMENTS

| | | | | |
|---|---|---|---|---|
| 5,855,681 A * | 1/1999 | Maydan | ............ | H01L 21/67167 118/719 |
| 6,143,082 A * | 11/2000 | McInerney | ......... | C23C 16/4412 118/719 |
| 6,176,929 B1 * | 1/2001 | Fukunaga | ........... | C23C 16/4412 118/715 |
| 6,277,237 B1 * | 8/2001 | Schoepp | ........... | H01J 37/32495 118/723 R |
| 6,413,321 B1 * | 7/2002 | Kim | .................... | C23C 16/0209 118/719 |
| 6,591,850 B2 * | 7/2003 | Rocha-Alvarez | .... | G05D 7/0635 137/101 |
| 6,635,115 B1 * | 10/2003 | Fairbairn | .......... | H01L 21/67201 118/715 |
| 6,962,644 B2 * | 11/2005 | Paterson | ........... | H01J 37/32082 118/719 |
| 6,963,043 B2 * | 11/2005 | Fink | .................. | H01J 37/32642 118/723 R |
| 7,311,784 B2 * | 12/2007 | Fink | .................. | H01J 37/32642 118/723 E |
| 7,648,610 B2 * | 1/2010 | Komiya | .............. | C23C 16/4412 118/715 |
| 7,663,121 B2 * | 2/2010 | Nowak | ................ | B05D 3/0209 250/453.11 |
| 8,075,728 B2 * | 12/2011 | Balakrishna | ...... | H01J 37/32449 118/715 |

(Continued)

*Primary Examiner* — Rudy Zervigon
(74) *Attorney, Agent, or Firm* — Slater Matsil, LLP

(57) ABSTRACT

A production tool includes a chamber, a heater in the chamber, and a pumping outlet on a side of the heater. A pumping liner is in the chamber and encircling the heater. The pumping liner and the heater have a first gap therebetween and a second gap therebetween. The second gap is different from the first gap, and the second gap is farther away from the first pumping outlet than the first gap.

20 Claims, 4 Drawing Sheets

(56) References Cited

U.S. PATENT DOCUMENTS

| | | | | |
|---|---|---|---|---|
| 8,197,636 B2* | 6/2012 | Shah | ............... | H01J 37/32366<br>118/719 |
| 8,236,105 B2* | 8/2012 | Bera | ............... | C23C 16/4412<br>118/715 |
| 8,617,347 B2* | 12/2013 | Kim | ............... | C23C 16/4412<br>118/715 |
| 8,771,417 B2* | 7/2014 | Yoon | ............... | H01J 37/32357<br>118/715 |
| 8,790,489 B2* | 7/2014 | Honda | ............... | H01J 37/18<br>118/715 |
| 2002/0134308 A1* | 9/2002 | Amano | ............... | C23C 16/4412<br>118/715 |
| 2003/0094135 A1* | 5/2003 | Komiya | ............... | C23C 16/4412<br>118/715 |
| 2003/0139035 A1* | 7/2003 | Yim | ............... | C23C 16/30<br>438/643 |
| 2003/0176074 A1* | 9/2003 | Paterson | ............... | H01J 37/32082<br>438/710 |
| 2003/0227258 A1* | 12/2003 | Strang | ............... | H01J 37/32449<br>315/111.21 |
| 2005/0167052 A1* | 8/2005 | Ishihara | ............... | H01J 37/32834<br>156/345.47 |
| 2005/0224180 A1* | 10/2005 | Bera | ............... | C23C 16/4412<br>156/345.33 |
| 2005/0241579 A1* | 11/2005 | Kidd | ............... | C23C 16/45565<br>118/715 |
| 2005/0247265 A1* | 11/2005 | Devine | ............... | H01L 21/6719<br>118/719 |
| 2006/0249175 A1* | 11/2006 | Nowak | ............... | C23C 16/4405<br>134/1 |
| 2006/0251827 A1* | 11/2006 | Nowak | ............... | B05D 3/0209<br>427/558 |
| 2007/0022959 A1* | 2/2007 | Bercaw | ............... | C23C 16/4401<br>118/728 |
| 2008/0035605 A1* | 2/2008 | Takahashi | ............... | H01J 37/32844<br>216/58 |
| 2011/0031214 A1* | 2/2011 | Kim | ............... | C23C 16/4412<br>216/59 |
| 2011/0162803 A1* | 7/2011 | Palagashvili | ............... | H01J 37/32091<br>156/345.54 |
| 2013/0269876 A1* | 10/2013 | Kim | ............... | H01L 21/3065<br>156/345.34 |

\* cited by examiner

ASYMMETRICAL CHAMBER CONFIGURATION

BACKGROUND

Integrated circuit manufacturing processes involves a plurality of deposition steps, including the deposition of metal layers, dielectric layers, polysilicon layers, etc. These processes also involve the deposition of blanket layers and gap fillings. For example, the formation processes of Shallow Trench Isolation (STI) regions involve the filling of trenches in semiconductor substrates with dielectric materials.

It is difficult to maintain the within-wafer uniformity in the thickness of the deposited layers. The deposited layers often have different thicknesses in the regions close to the center axis of the wafers and the regions close to the edges of the wafers. Furthermore, the within-wafer uniformity is also affected by the configurations of production tools. The within-wafer uniformity has effect on subsequent process steps and manufacturing yield, and a low within-wafer uniformity may result in the loss in the manufacturing yield.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

An asymmetric chamber configuration is provided in accordance with various exemplary embodiments. The variations and the operation of the chamber in accordance with embodiments are discussed. Throughout the various views and illustrative embodiments, like reference numbers are used to designate like elements.

Figure 1:
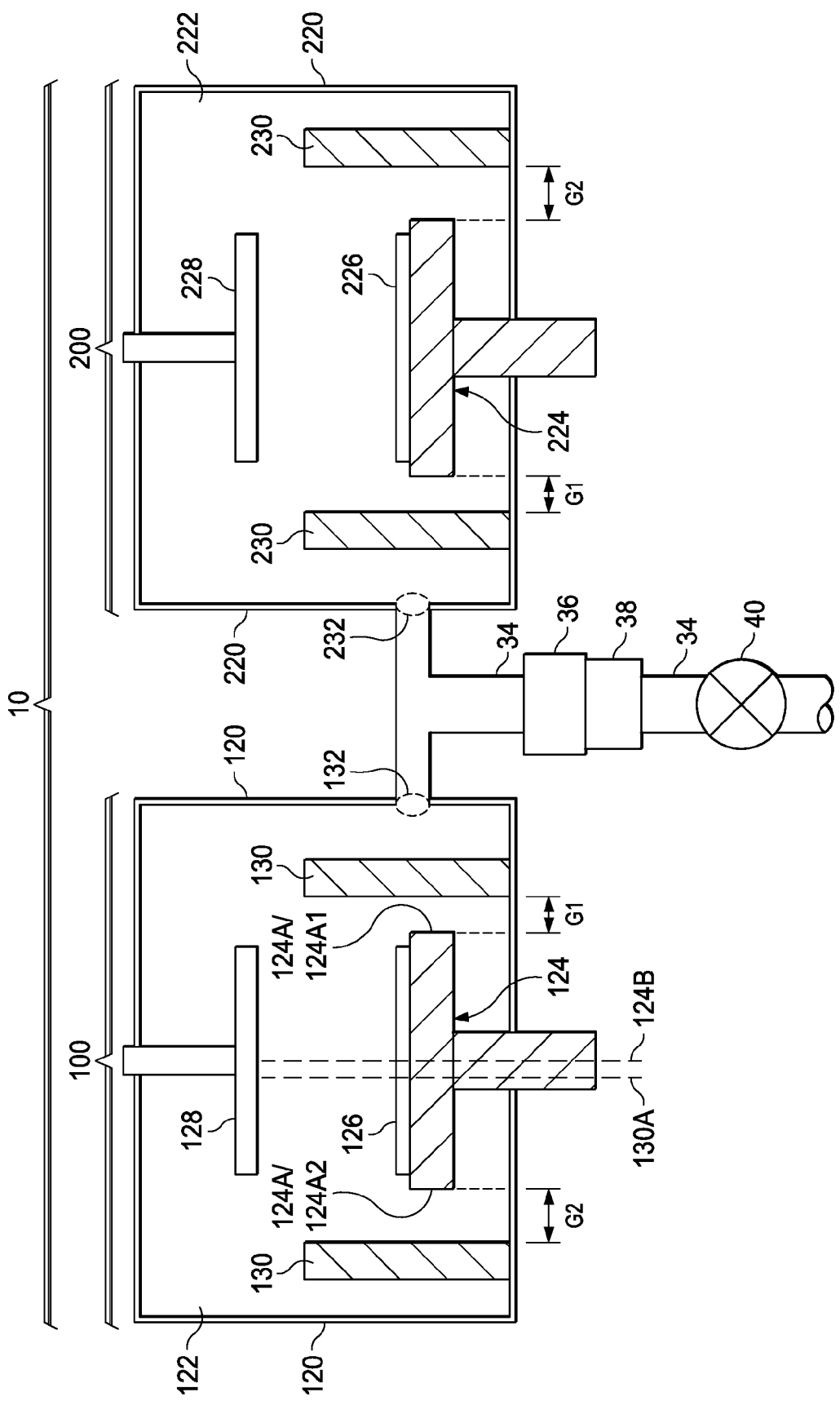
FIG. 1 illustrates a cross-sectional view of a production tool including two deposition chambers in accordance with some exemplary embodiments.

FIG. 1 illustrates a cross-sectional view of multi-chamber production tool 10. In accordance with embodiments, production tool 10 includes chambers 100 and 200, which are configured to be vacuumed. Chamber 100 may have a structure identical to chamber 100, and have essentially same functions. Accordingly, the details of chamber 100 are discussed, and the details of chamber 200 and the components therein may be found referring to the description of chamber 100 and the corresponding components therein. The reference numerals of the features in chamber 200 are also denoted similar to the reference numerals of the features in chamber 100, except that the reference numerals of the features in chamber 100 start with number "1," while the reference numerals of the features in chamber 100 start with number "2."

Chamber 100 and 200 are used for depositing materials/layers on wafer 126 and 226, respectively. In some embodiments, chambers 100 and 200 are configured to perform High Aspect Ratio Processes (HARP), which may be used for the gap filling of high-aspect-ratio trenches. In alternative embodiments, chambers 100 and 200 are configured to perform other types of processes including, and not limited to, Chemical Vapor Deposition (CVD), High-Density Process (HDP). The respective materials that may be formed using chambers 100 and 200 include low-k materials that are used in back end processes, wherein the low-k materials may be extreme low-k (ELK) materials that have k values lower than about 2.0, for example. Chambers 100 and 200 may also be used for forming Phospho-Silicate Glass (PSG), Boro-Silicate Glass (BSG), Boron-Doped Phospho-Silicate Glass (BPSG), Tetraethyl Orthosilicate (TEOS) oxide, or the like.

Figure 4:
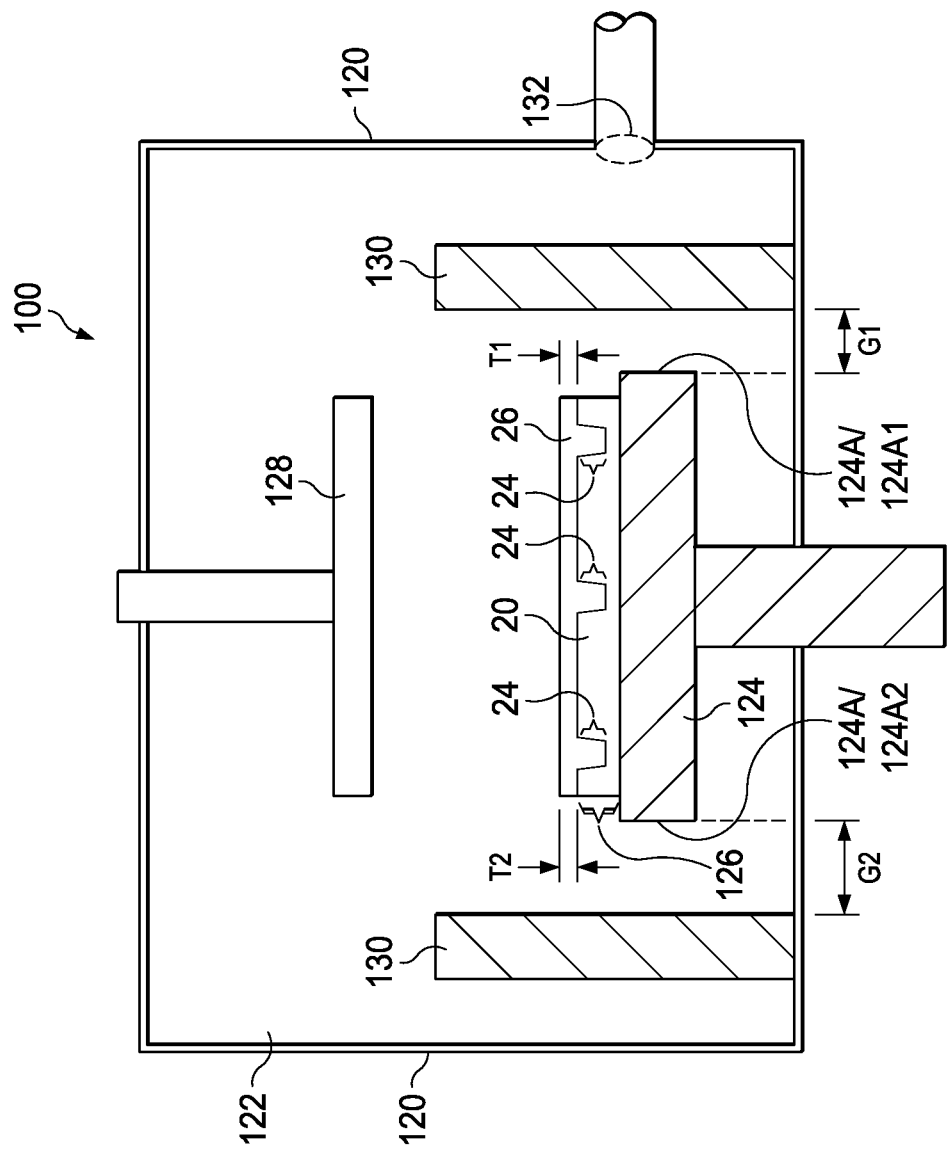
FIG. 4 illustrates a wafer in a production tool, wherein a dielectric layer is deposited on the wafer.

Chamber 100 includes chamber wall 120, which defines space 122 therein. Space 122 can be vacuumed. Heater 124 is disposed in chamber 100, and is configured to support and heat wafer 126 that is placed over heater 124 to a desirable temperature. Shower head 128 is disposed over heater 124 and wafer 126, and is configured to conduct process gases into chamber 100. Chamber 100 is configured to deposit a material on wafer 126. In some exemplary embodiments, as shown in FIG. 4, chamber 100 is used to deposit dielectric material 26 (such as silicon oxide) into trenches 24 in semiconductor substrate 20, wherein semiconductor substrate 20 is a part of wafer 126. This process may be used for forming Shallow Trench Isolation (STI) regions. In alternative embodiments, chamber 100 is used to deposit other types of materials such as a metal, polysilicon, a semiconductor material, or the like, on wafer 126.

Referring back to FIG. 1, pumping liner 130 is disposed in chamber 100. Pumping liner 130 comprises a ceramic in some exemplary embodiments. Pumping liner 130 may not be heated. Pumping liner 130 has a shape of a hollow cylinder that does not have a top cover and a bottom cover. Pumping liner 130 may have a solid and smooth wall, which forms a ring. The bottom of pumping liner 130 resides on the bottom panel of chamber 100. Pumping liner 130 forms a ring that encircles wafer 126 and heater 124. The top edge of pumping liner 130 may be higher than the top surface of wafer 126 and the top surface of heater 124.

Chamber wall 120 includes pumping outlet 132, which is on the side facing chamber 200. Similarly, chamber wall 220 of chamber 200 includes pumping outlet 232, which is on the side facing chamber 100. Pumping outlets 132 and 232 are connected to a common pumping outlet pipe 34. In some embodiments, isolation valve 36 and throttle valve 38 are installed on pumping outlet pipe 34. Pump 40 may further be connected to pumping outlet pipe 34. Through pumping outlets 132 and 232, pump 40 evacuates the process gases in chambers 100 and 200 simultaneously.

Figure 2:
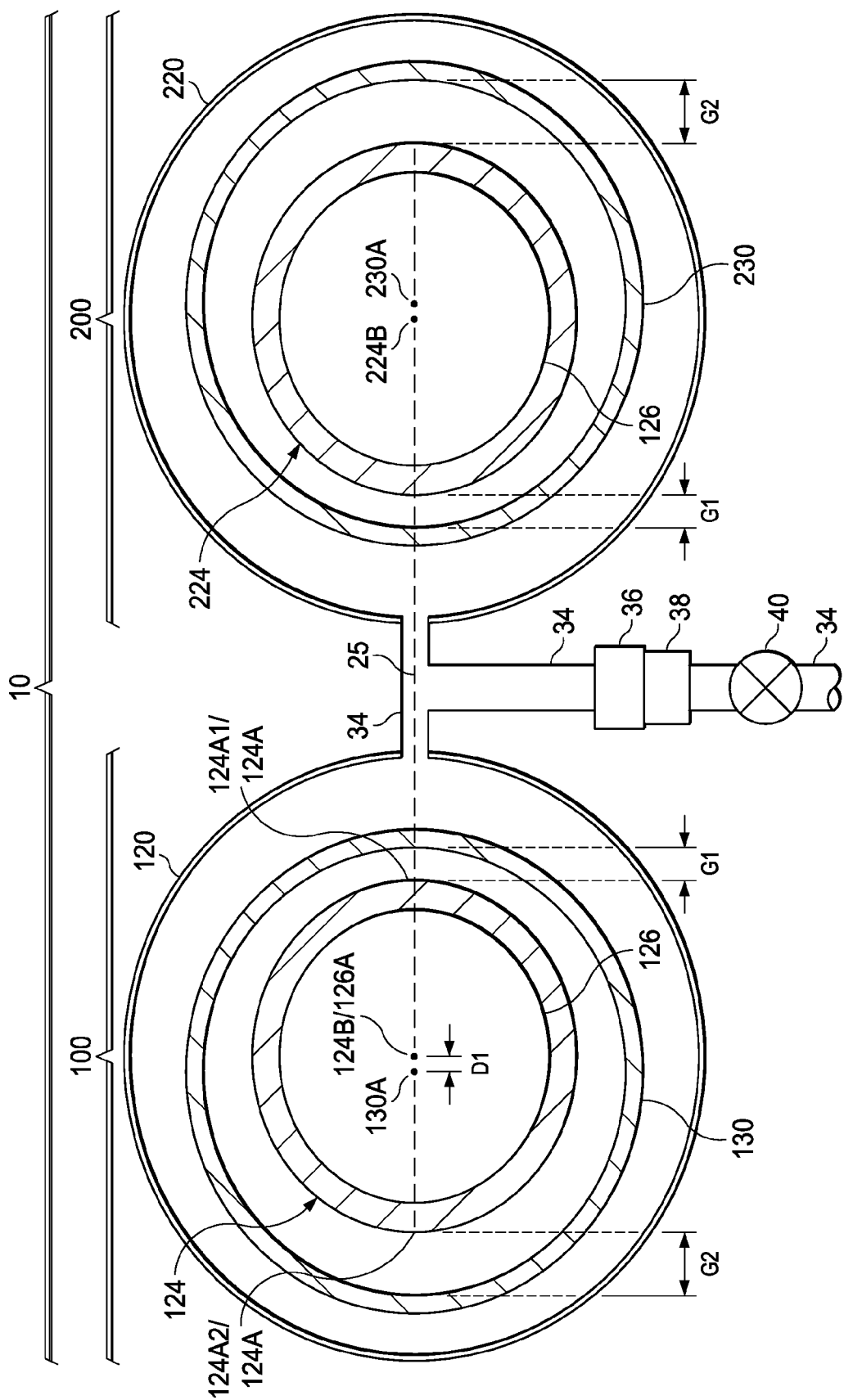
FIG. 2 illustrates a top view of a production tool including two deposition chambers in accordance with some exemplary embodiments.

Referring to FIG. 2, which is a top view of production 10, edge 124A of heater 124 may form a ring, which has center axis 124B. Edge 124A includes edge portions 124A1 and 124A2 opposite to each other. Edges portion 124A1 is closest to pumping outlet 132 among all other portions of edge 124A. Edges portion 124A2 is farthest from pumping outlet 132 among all portions of edge 124A. Edge portion 124A1 and edge portion 124A2 are on opposite sides of center axis 124B of heater 124. In some embodiments, edge portion 124A1 is between center axis 124B and pumping outlet 132, and may be substantially aligned to line 25 that is drawn to connect center axis 124B and pumping outlet 132.

In some embodiments, wafer 126 has center axis 126A, which may be aligned to center axis 124B of heater 124. Pumping outlets 132 and 232 may be substantially aligned to line 25, which is drawn to connect center 124B of heater 124 to center 224B of heater 224. Furthermore, in the top view shown in FIG. 2, chamber wall 120 forms a ring, and the center axis of the ring may be aligned to center axis 124B and 126A. In alternative embodiments, the center axis of chamber wall 120 is not aligned to center axes 124B and 126A. In yet alternative embodiments, chamber wall 120 has other top-view shapes other than the ring.

As shown in FIGS. 1 and 2, edge portion 124A1 of heater 124 and pumping liner 130 forms a gap therebetween, and the size of the gap, which is the distance between edge portion 124A1 and the nearest portion of pumping liner 130, is denoted as G1. Edge portion 124A2 of heater 124 and pumping liner 130 form a gap, and the size of the gap, which is the distance between edge portion 124A2 and the nearest portion of pumping liner 130, is denoted as G2. Gap G1 is different from, and may be smaller than, gap G2. Accordingly, chambers 100 and 200 are referred to as having an asymmetric configuration. In some embodiments, ratio G2/G1 is greater than about 1.25, greater than about 2, or greater than about 2.5. For example, gap G2 may be between about 0.2 inches and about 0.25 inches, and gap G1 may be between about 0.08 inches and about 0.15 inches. It is appreciated, however, that the values recited throughout the description are merely examples, and may be changed to different values.

Referring again to FIG. 2, center axis 130A of pumping liner 130 may be misaligned with center axis 124B of heater 124. In some embodiments, distance D1 between center axis 130A of pumping liner 130 and center axis 124B of heater 124 is greater than about 0.08 inches, and may be between about 0.01 inches and about 0.15 inches. Gap G1 may be the smallest gap between heater 124 and pumping liner 130, and gap G2 may be the greatest gap between heater 124 and pumping liner 130.

FIG. 4 shows chamber 100 and a more detailed view of wafer 126. Wafer 126 includes semiconductor substrate 20. Trenches 24 are formed in substrate 20. In the formation of STI regions, trenches 24 are filled with dielectric material 26 such as an oxide. With gap G1 smaller than gap G2, the temperature profile of different portions of wafer 126 is different from if gaps G1 and G2 are equal to each other. For example, by shifting pumping liner 130 away from pumping outlet 132, the temperatures of the portions of wafer 126 closer to pumping outlet 132 may be reduced, and the temperatures of the portions of wafer 126 farther away from pumping outlet 132 may be increased. The change in the temperature profile affects the thickness profile of the deposited material 26. For example, thickness T1, which is the portion of dielectric material 26 close to pumping outlet 132, is increased, while thickness T2, which is the portion of dielectric layer 26 farther away from pumping outlet 132, is reduced. The change in the thickness profile compensates for the non-uniformity in the thickness of dielectric material 26, and the thickness of dielectric material 26 is more uniform than if gap G1 is equal to gap G2. As a comparison to the asymmetric configuration of chambers 100 and 200, if gap G1 is equal to gap G2, dielectric material 26 on wafer 126 may have thickness T1 smaller than thickness T2. The difference between thicknesses T1 and T2 may be caused due to the configuration that pumping outlet 132 is on one side of wafer 126, and hence in response to the pumping of process gases from one side of chamber 100, the temperatures of wafer 126 is not uniform.

Figure 3:
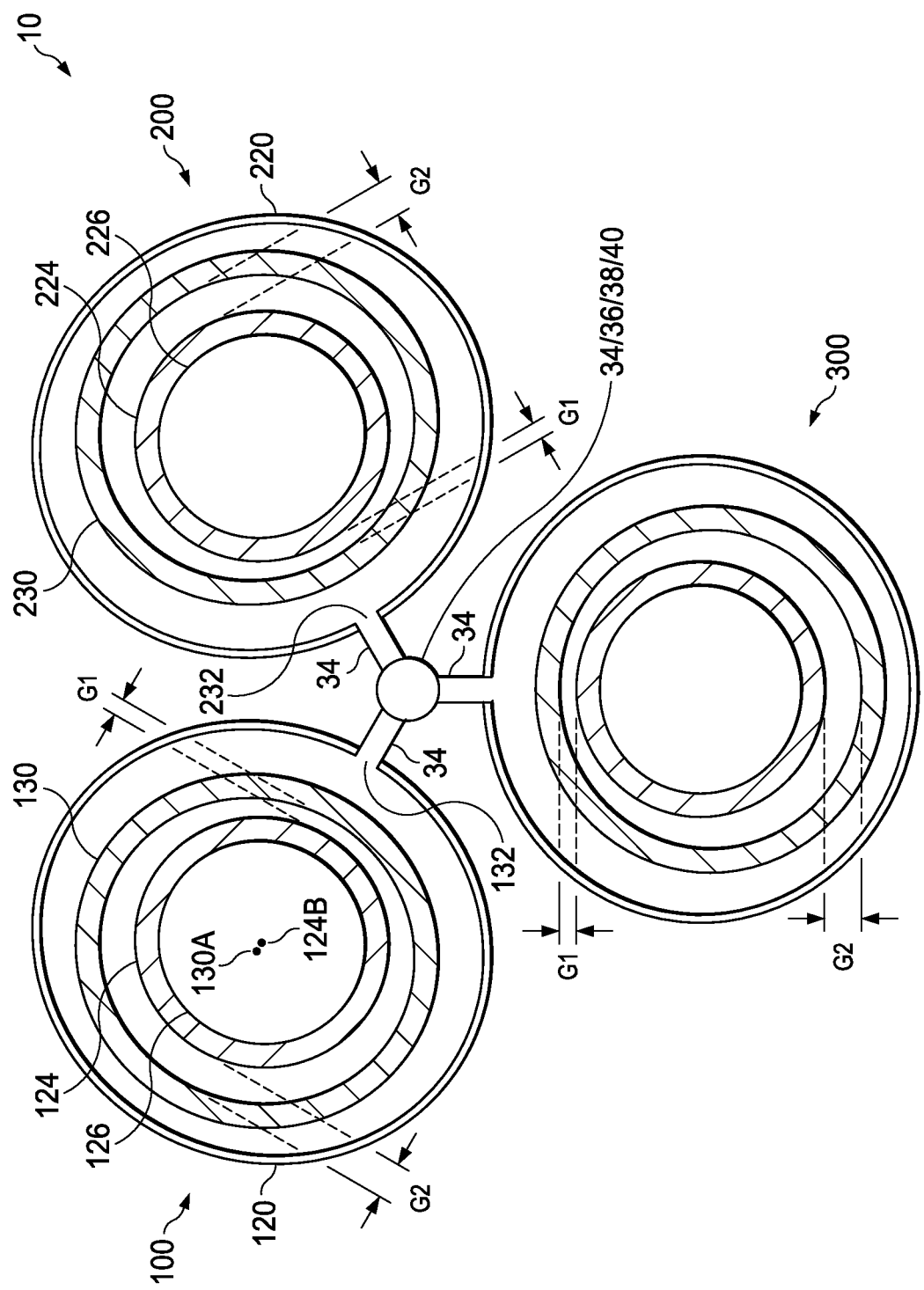
FIG. 3 illustrates a top view of a production tool including three deposition chambers in accordance with some exemplary embodiments.

The embodiments may be applied on production tools having three or more chambers sharing a common pumping pipe. For example, referring to FIG. 3, chambers 100, 200, and 300 share a same pumping pipe outlet 34, isolation valve 36, throttle valve 38, and pump 40. In accordance with embodiments, in each of chambers 100, 200, and 200, gaps G1 may also be smaller than gaps G2.

In accordance with embodiments, a production tool includes a chamber, a heater in the chamber, and a pumping outlet on a side of the heater. A pumping liner is in the chamber and encircling the heater. The pumping liner and the heater have a first gap therebetween and a second gap therebetween. The second gap is different from the first gap, and the second gap is farther away from the first pumping outlet than the first gap.

In accordance with other embodiments, a production tool includes a chamber, and a heater in the chamber. An edge of the heater forms a first ring having a first center axis. The heater is configured to have a wafer placed thereon. A pumping outlet is on a side of the heater. A pumping liner forms a second ring encircling the heater, wherein the second ring has a second center axis misaligned to the first center axis.

In accordance with yet other embodiments, a production tool includes a first chamber, a first heater in the first chamber, a first pumping outlet in a chamber wall of the first chamber, and a first pumping liner in the first chamber and encircling the first heater. The first pumping liner and the first heater have a first gap therebetween, and a second gap therebetween, wherein the second gap is different from the first gap, and wherein the second gap is farther away from the first pumping outlet than the first gap. The production tool further includes a second chamber, a second heater in the second chamber, and a second pumping outlet in a chamber wall of the second chamber, wherein the first and the second pumping outlets are disposed between the first and the second heaters. A pumping pipe is connected to the first and the second pumping outlets. A second pumping liner is disposed in the second chamber and encircling the second heater. The second pumping liner and the second heater have a third gap therebetween, and a fourth gap therebetween, wherein the fourth gap is different from the third gap, and the fourth gap is farther away from the second pumping outlet than the third gap.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. An apparatus comprising:
   a center outlet pipe;
   a first reactor, a second reactor, and a third reactor surrounding the center outlet pipe and separated from each other by 120 degrees from each other, wherein each of the first reactor, the second reactor, and the second reactor comprises:
   a chamber;
   a heater in the chamber;
   a pumping outlet on a side of the heater, wherein the pumping outlet is connected to the center outlet pipe; and
   a pumping liner in the chamber and encircling the heater, wherein the pumping liner and the heater have a first gap therebetween, and a second gap therebetween, with the first gap and the second gap being measured in a same plane parallel to a major top surface of the heater, wherein the second gap is greater than the first gap, and wherein the second gap is farther away from the pumping outlet than the first gap.

2. The apparatus of claim 1, wherein the pumping liner forms a ring, with the ring having a center axis farther away from the pumping outlet than a center axis of the heater.

3. The apparatus of claim 1, wherein the first gap is between a center axis of the heater and the pumping outlet, and the first and the second gaps are on opposite sides of the center axis of the heater, and wherein the first gap is substantially the smallest gap among all gaps between the heater and the pumping liner in the respective one of the first reactor, the second reactor, and the third reactor, and the second gap is the greatest gap among the all gaps.

4. The apparatus of claim 1, wherein the pumping liner forms a hollow cylinder, with a top of the pumping liner higher than a top surface of the heater.

5. The apparatus of claim 1, wherein the first and the second gaps in a same one of the first reactor, the second reactor, and the third reactor are measured in locations aligned to a straight line, and the straight line passes the center outlet pipe in a top view of the apparatus.

6. The apparatus of claim 1, wherein the center outlet pipe is at a center of the first reactor, the second reactor, and the third reactor.

7. An apparatus comprising:
   a first chamber;
   a first heater in the first chamber, wherein an edge of the first heater forms a first ring having a first center axis, and wherein the first heater is configured to have a wafer placed thereon;
   a first pumping outlet on a side of the first heater;
   a first pumping liner forming a second ring encircling the first heater, wherein the second ring has a second center axis misaligned with the first center axis;
   a second chamber;
   a second heater in the second chamber, wherein an edge of the second heater forms a third ring having a third center axis;
   a second pumping outlet on a side of the second heater;
   a second pumping liner forming a fourth ring encircling the first heater, wherein the fourth ring has a fourth center axis misaligned with the third center axis;
   a third chamber, wherein the first chamber, the second chamber, and the third chamber are separated from each other by 120 degrees;
   a third heater in the third chamber, wherein an edge of the third heater forms a fifth ring having a fifth center axis;
   a third pumping outlet on a side of the third heater; and
   a third pumping liner forming a sixth ring encircling the first heater, wherein the sixth ring has a sixth center axis misaligned with the fifth center axis.

8. The apparatus of claim 7, wherein the first center axis is between the second center axis and the first pumping outlet.

9. The apparatus of claim 8, wherein the first center axis is substantially aligned to a line drawn between the second center axis and the first pumping outlet.

10. The apparatus of claim 7, wherein the first pumping liner comprises a ceramic.

11. The apparatus of claim 7 further comprising a center outlet pipe located at a center of, and connected to, the first chamber, the second chamber, and the third chamber, wherein the first pumping outlet, the second pumping outlet, and the third pumping outlet.

12. The apparatus of claim 7, wherein the first center axis and the second center axis are separated from each other by a distance in a range between about 0.01 inches and about 0.15 inches.

13. An apparatus comprising:
   a first reactor having a first G1 and a first G2;
   a second reactor having a second G1 and a second G2; and
   a third reactor having a third G1 and a third G2, wherein the first reactor, the second reactor, and the third reactor are located around a center, with the first reactor, the second reactor, and the third reactor separated from each other by 120 degrees, and wherein each of the first reactor, the second reactor, and the third reactor comprises:
   a chamber;
   a heater in the chamber; and
   a pumping liner in the chamber and encircling the heater, wherein the first G1, the second G1, and the third G1 are first distances between the pumping liner and the heater of the respective first reactor, the second reactor, and the third reactor, and the first G2, the second G2, and the third G2 are second distances between the pumping liner and the heater of the respective first reactor, the second reactor, and the third reactor, and each of the first G1, the second G1, and the third G1 are smaller than each of the first G2, the second G2, and the third G2, respectively.

14. The apparatus of claim 13, wherein the chamber of each of the first reactor, the second reactor, and the third reactor comprises a pumping outlet, and the apparatus comprises a center outlet pipe connected to the pumping outlets of the chambers of the first reactor, the second reactor, and the third reactor.

15. The apparatus of claim 13, wherein the first G1 is substantially the smallest gap among all gaps between the heater and the pumping liner in the first reactor, and the first G2 is the greatest gap among the all gaps.

16. The apparatus of claim 13, wherein the pumping liner forms a hollow cylinder, with a top of the pumping liner higher than a top surface of the heater.

17. The apparatus of claim 13, wherein the first pumping liner forms a ring, and the ring has a first center axis farther away from the center than a second center axis of the heater.

18. The apparatus of claim 17, wherein the first center axis, the second center axis, and the center are substantially aligned to a straight line.

19. The apparatus of claim 13, wherein a ratio of the first G2 to the first G1 is greater than about 1.25.

20. The apparatus of claim 1, wherein the pumping liner comprises a ceramic.

* * * * *